(12) United States Patent
Kondo et al.

(10) Patent No.: US 8,659,035 B2
(45) Date of Patent: Feb. 25, 2014

(54) LIGHT-EMITTING DEVICE, LIGHT-EMITTING DEVICE ARRAY, OPTICAL RECORDING HEAD, IMAGE FORMING APPARATUS, AND METHOD OF MANUFACTURING LIGHT-EMITTING DEVICE

(75) Inventors: Takashi Kondo, Kanagawa (JP); Taku Kinoshita, Kanagawa (JP); Kazutaka Takeda, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 13/476,526

(22) Filed: May 21, 2012

(65) Prior Publication Data
US 2013/0020592 A1 Jan. 24, 2013

(30) Foreign Application Priority Data

Jul. 21, 2011 (JP) .................................. 2011-159953
Feb. 27, 2012 (JP) .................................. 2012-039749

(51) Int. Cl.
H01L 33/00 (2010.01)
H01L 29/00 (2006.01)
H01L 21/332 (2006.01)

(52) U.S. Cl.
USPC .......... 257/88; 257/98; 257/E33.072; 438/29; 438/133

(58) Field of Classification Search
USPC .................. 257/115, 157, E27.052, E27.079, 257/E29.036–E29.038, E29.046–E29.048, 257/E29.115, E29.196, E29.211–E29.225, 257/E21.388, E21.393, E21.614, E21.677, 257/88, 98, E33.072; 438/29, 133
See application file for complete search history.

(56) References Cited

U.S. PATENT DOCUMENTS

| | | | | |
|---|---|---|---|---|
| 4,316,156 A * | 2/1982 | Scifres et al. | ................ | 372/50.1 |
| 5,084,748 A * | 1/1992 | Kasahara et al. | ............. | 257/432 |
| 5,226,053 A | 7/1993 | Cho et al. | | |
| 5,239,550 A * | 8/1993 | Jain | ............................ | 372/45.01 |
| 5,338,944 A * | 8/1994 | Edmond et al. | ................. | 257/76 |
| 5,404,373 A * | 4/1995 | Cheng | ....................... | 372/50.124 |
| 5,451,977 A * | 9/1995 | Kusuda et al. | ................... | 345/44 |
| 5,493,577 A * | 2/1996 | Choquette et al. | ........ | 372/46.013 |
| 5,565,694 A * | 10/1996 | Huang et al. | .................... | 257/97 |
| 5,744,829 A * | 4/1998 | Murasato et al. | ............... | 257/94 |
| 5,956,363 A * | 9/1999 | Lebby et al. | ............. | 372/46.013 |
| 6,185,241 B1 * | 2/2001 | Sun | ................................ | 372/96 |

(Continued)

FOREIGN PATENT DOCUMENTS

| | | |
|---|---|---|
| JP | A-01-238962 | 9/1989 |
| JP | A-05-275739 | 10/1993 |
| JP | A-2007-250961 | 9/2007 |

*Primary Examiner* — David S Blum
(74) *Attorney, Agent, or Firm* — Oliff PLC

(57) ABSTRACT

Provided is a light-emitting device including a semiconductor substrate of a first conductivity type, a semiconductor multilayer reflection mirror of the first conductivity type, formed on the semiconductor substrate, a first semiconductor layer of the first conductivity type, formed on the semiconductor multilayer reflection mirror, a second semiconductor layer of a second conductivity type, formed on the first semiconductor layer, a third semiconductor layer of the first conductivity type, formed on the second semiconductor layer, a fourth semiconductor layer of the second conductivity type, formed on the third semiconductor layer, a first electrode formed on a rear surface of the semiconductor substrate, and a second electrode formed on the fourth semiconductor layer, wherein the semiconductor multilayer reflection mirror includes a first selectively oxidized region and a first conductive region adjacent to the first oxidized region, and the first conductive region electrically connects the semiconductor substrate and the first semiconductor layer.

22 Claims, 13 Drawing Sheets

(56) References Cited

U.S. PATENT DOCUMENTS

| | | | |
|---|---|---|---|
| 6,238,944 B1* | 5/2001 | Floyd | 438/45 |
| 6,680,963 B2* | 1/2004 | Liao et al. | 372/96 |
| 6,720,585 B1* | 4/2004 | Wasserbauer et al. | 257/98 |
| 6,865,214 B2* | 3/2005 | Kim | 372/96 |
| 7,596,163 B2* | 9/2009 | Yoshikawa et al. | 372/50.124 |
| 7,989,841 B1* | 8/2011 | Bratkovski et al. | 257/107 |
| 8,270,448 B2* | 9/2012 | Kondo et al. | 372/50.124 |
| 8,288,786 B2* | 10/2012 | Hwang et al. | 257/98 |
| 2001/0050934 A1* | 12/2001 | Choquette et al. | 372/43 |
| 2003/0048822 A1* | 3/2003 | Nakatsu et al. | 372/43 |
| 2003/0235226 A1* | 12/2003 | Ueki | 372/46 |
| 2005/0180478 A1* | 8/2005 | Sakamoto et al. | 372/50.1 |
| 2005/0230705 A1* | 10/2005 | Taylor | 257/120 |
| 2005/0271106 A1* | 12/2005 | Watanabe et al. | 372/46.013 |
| 2005/0271107 A1* | 12/2005 | Murakami et al. | 372/50.1 |
| 2006/0227836 A1* | 10/2006 | Omori et al. | 372/50.124 |
| 2007/0114541 A1* | 5/2007 | Edmond et al. | 257/79 |
| 2008/0279229 A1* | 11/2008 | Suzuki et al. | 372/19 |
| 2009/0121246 A1* | 5/2009 | Denbaars et al. | 257/98 |
| 2009/0268769 A1* | 10/2009 | Jikutani | 372/45.01 |
| 2009/0296754 A1* | 12/2009 | Ledentsov et al. | 372/20 |
| 2009/0297223 A1* | 12/2009 | Suzuki | 399/221 |
| 2010/0208760 A1* | 8/2010 | Yoshikawa | 372/44.01 |
| 2010/0231682 A1* | 9/2010 | Ohno | 347/238 |
| 2010/0322277 A1* | 12/2010 | Uchida | 372/45.01 |
| 2011/0182316 A1* | 7/2011 | Kondo et al. | 372/50.12 |
| 2011/0317540 A1* | 12/2011 | Matsushita et al. | 369/121 |

* cited by examiner

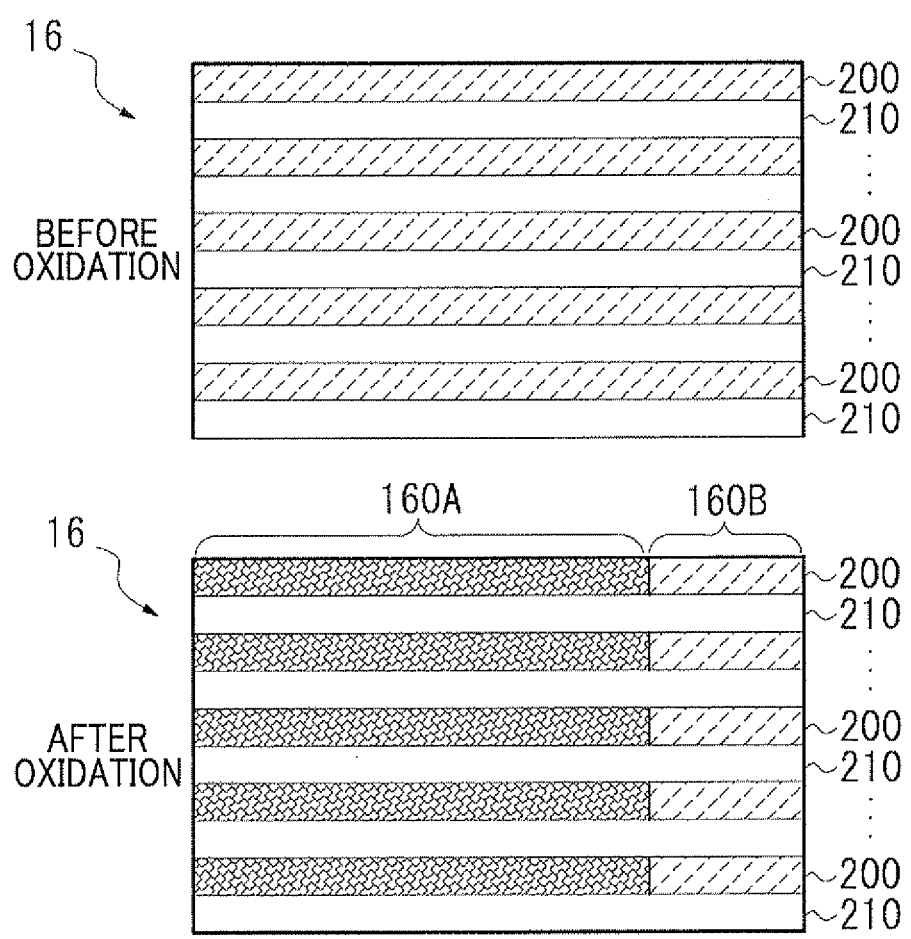

LIGHT-EMITTING DEVICE, LIGHT-EMITTING DEVICE ARRAY, OPTICAL RECORDING HEAD, IMAGE FORMING APPARATUS, AND METHOD OF MANUFACTURING LIGHT-EMITTING DEVICE

CROSS-REFERENCE TO RELATED APPLICATIONS

This application is based on and claims priority under 35 USC 119 from Japanese Patent Application Nos. 2011-159953 filed Jul. 21, 2011 and 2012-039749 filed Feb. 27, 2012.

BACKGROUND (i) Technical Field

The present invention relates to a light-emitting device, a light-emitting device array, an optical recording head, an image forming apparatus, and a method of manufacturing the light-emitting device.

(ii) Related Art

A surface-emitting device array is used in a contact image sensor or a recording head of a printer. A typical surface-emitting device array is formed by integrating multiple light-emitting devices which are arranged on a single substrate in a linear form. As a representative example of a surface-emitting device, a light-emitting diode (LED), a light-emitting thyristor, and a laser diode are known. In the light-emitting diode, light radiation in an active region is isotropic, only a part of the radiated light is emitted from an uppermost layer, and light radiated toward a substrate is absorbed by the substrate.

Moreover, the light-emitting thyristor has a PNPN structure obtained by stacking compound semiconductor layers (GaAs, AlGaAs, or the like), and a gate voltage and/or a gate current is applied to a gate electrode, whereby light is emitted by the recombination of electrons and holes injected from an anode electrode and a cathode electrode. A self-scanning light-emitting device array has been put into practical use in which a light-emitting thyristor array having such a PNPN structure has a self-scanning function so that respective light-emitting thyristors are lit sequentially.

SUMMARY

According to an aspect of the present invention, there is provided a light-emitting device including: a semiconductor substrate of a first conductivity type; a semiconductor multilayer reflection mirror of the first conductivity type, formed on the semiconductor substrate; a first semiconductor layer of the first conductivity type, formed on the semiconductor multilayer reflection mirror; a second semiconductor layer of a second conductivity type different from the first conductivity type, formed on the first semiconductor layer; a third semiconductor layer of the first conductivity type, formed on the second semiconductor layer; a fourth semiconductor layer of the second conductivity type, formed on the third semiconductor layer; a first electrode formed on a rear surface of the semiconductor substrate; and a second electrode formed on the fourth semiconductor layer, wherein the semiconductor multilayer reflection mirror includes a first oxidized region which is selectively oxidized and a first conductive region adjacent to the first oxidized region, and the first conductive region electrically connects the semiconductor substrate and the first semiconductor layer.

BRIEF DESCRIPTION OF THE DRAWINGS

Exemplary embodiments of the present invention will be described in detail based on the following figures, wherein:

FIG. 4B is a cross-sectional view illustrating the structure of a semiconductor multilayer reflection mirror of a light-emitting thyristor according to a third exemplary embodiment of the present invention;

DETAILED DESCRIPTION

Figure 1:
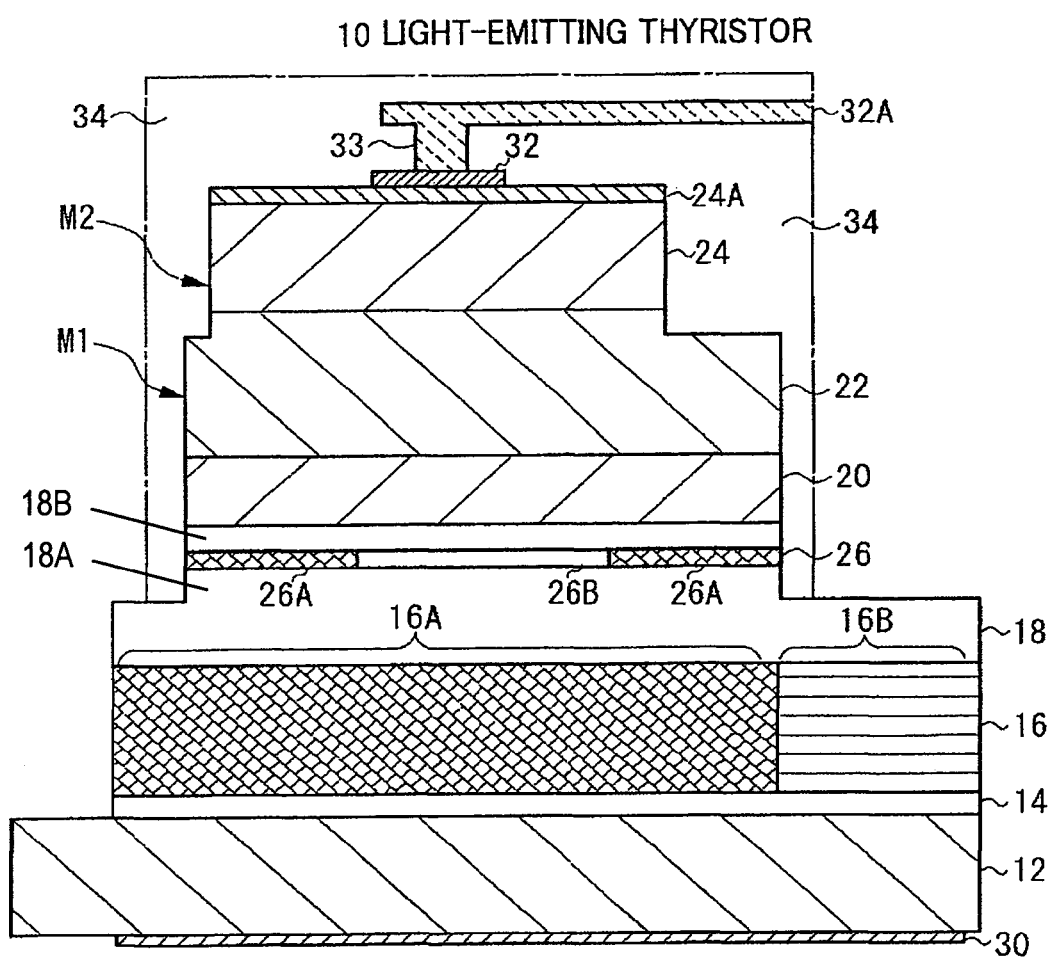
FIG. 1 is a schematic cross-sectional view illustrating the structure of a light-emitting thyristor according to a first exemplary embodiment of the present invention, taken along the line I-I in FIG. 2.

Exemplary embodiments of the present invention will be described with reference to the accompanying drawings. In the present exemplary embodiments, a light-emitting thyristor and a light-emitting thyristor array are illustrated as an example of surface-emitting devices. It will be appreciated that the scales used in the drawings are exaggerated to make the features of the invention better understood and are not necessarily identical to the scales of actual devices.

[Exemplary Embodiments]

Figure 2:
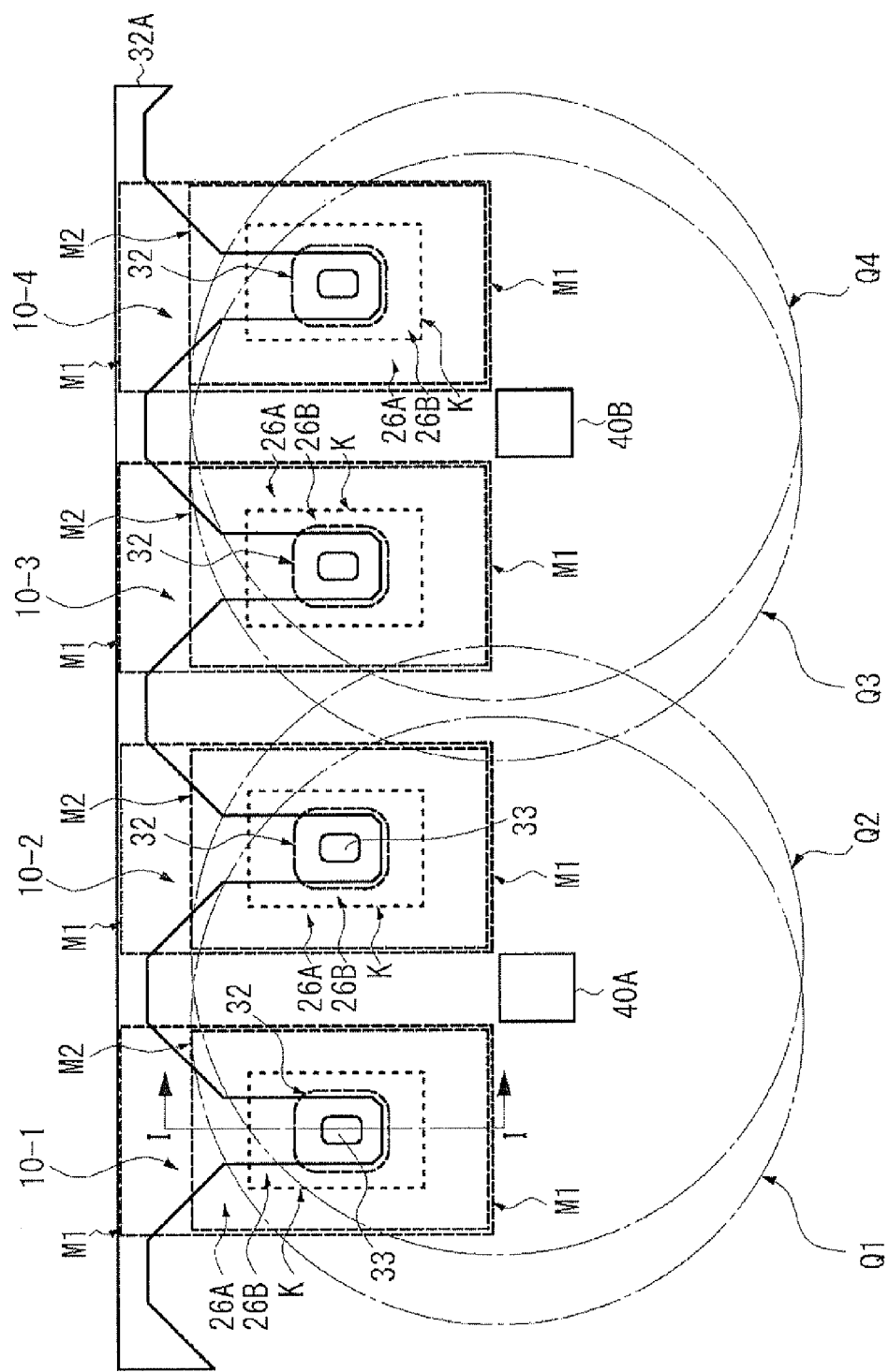
FIG. 2 is a schematic plan view of a light-emitting thyristor array according to the first exemplary embodiment of the present invention.

FIG. 1 is a cross-sectional view illustrating a schematic structure of a light-emitting thyristor according to a first exemplary embodiment of the present invention, and FIG. 2 is a plan view of a light-emitting thyristor array according to the first exemplary embodiment of the present invention. FIG. 2 illustrates a light-emitting thyristor array including four light-emitting thyristors arranged linearly, and FIG. 1 illustrates one light-emitting thyristor 10 illustrated by the cross-sectional view along the line I-I in FIG. 2.

The light-emitting thyristor 10 of the present exemplary embodiment is formed by sequentially stacking a p-type buffer layer 14, a p-type semiconductor multilayer reflection mirror 16, a p-type first semiconductor layer 18, an n-type second semiconductor layer 20, a p-type third semiconductor layer 22, and an n-type fourth semiconductor layer 24 on a p-type semiconductor substrate 12 by epitaxial growth. The semiconductor substrate 12 and the semiconductor layers stacked thereon are made of III-V compound semiconductors. In this example, the semiconductor substrate 12 and the semiconductor layers stacked thereon are made from GaAs or AlGaAs.

A rear-surface electrode 30 as an anode-side electrode is formed on the rear surface of the semiconductor substrate 12, and an upper electrode 32 as a cathode-side electrode is formed on the fourth semiconductor layer 24. Although the entire surface of the light-emitting thyristor is covered by an insulating film such as SIGN, in this example, an insulating film 34 (in the figure, indicated by a chain line) covering a mesa structure M1 and a mesa structure M2 is illustrated. The upper electrode 32 is connected to a metal wiring 32A (see FIG. 2) which is the upper layer thereof via a contact hole 33 formed in the insulating film 34. Although not shown, a gate electrode is electrically connected to the third semiconductor layer 22, and a driving signal for self-scanning the light-emitting thyristor is applied to the gate electrode.

A p-type GaAs buffer layer 14 is preferably formed on the p-type GaAs substrate 12, and the p-type semiconductor multilayer reflection mirror 16 that forms a distributed Bragg reflector (hereinafter referred to as DBR) is formed on the buffer layer 14. The semiconductor multilayer reflection mirror 16 is formed by stacking multiple pairs of semiconductor layers, one having a high refractive index and the other having a low refractive index. In this example, a low Al semiconductor layer in which the Al content is low is used as a high refractive index layer, and a high Al semiconductor layer in which the Al content is high is used as a low refractive index layer. For example, the low Al semiconductor layer is made from $Al_{0.3}Ga_{0.7}As$ in which the Al content ratio is about 30%, and the high Al semiconductor layer is made from AlAs, for example. However, the high Al semiconductor layer may be made from $Al_{0.98}Ga_{0.02}As$ in which the Al content ratio is 98% or more, for example. Preferably, the thickness of each of the high refractive index layer and the low refractive index layer is $\lambda/4n_r$ ($n_r$ is a refractive index of a medium) when the central wavelength of light output by the light-emitting thyristor is $\lambda$. The $n_r$ of the low refractive index layer is the refractive index after oxidation, namely, of $Al_xO_y$.

The reflectivity of the semiconductor multilayer reflection mirror 16 depends on a difference in refractive index between the high refractive index layer and the low refractive index layer. That is, the reflectivity increases as the difference between the refractive indices increases. The refractive index of AlAs is about 3, the refractive index of the $Al_{0.3}Ga_{0.7}As$ layer is about 3.4, and thus, the difference in refractive index is about 0.4. However, since the refractive index of AlAs decreases to about 1.7 when it is oxidized, a large difference in refractive index is obtained when oxidized AlAs is used. Therefore, it is possible to increase the reflectivity of the semiconductor multilayer reflection mirror 16 with a small number of pairs.

In the present exemplary embodiment, the semiconductor multilayer reflection mirror 16 includes an oxidized DBR 16A which is partially oxidized and a conductive DBR 16B adjacent to the oxidized DBR 16A. When a light-emitting thyristor array is manufactured, as illustrated in FIG. 2, holes 40A and 40B extending to the semiconductor multilayer reflection mirror 16 are formed, and a part of the semiconductor multilayer reflection mirror 16 is exposed through the holes 40A and 40B. Oxidation is performed using the portion exposed through the holes. When the semiconductor multilayer reflection mirror 16 is oxidized, since the oxidation rate of AlAs is remarkably faster than that of $Al_{0.3}Ga_{0.7}As$ with a low Al content, it is possible to obtain the oxidized DBR 16A having a desired size by substantially controlling the oxidation time of AlAs. Eventually, the oxidized DBR 16A is substituted with the pair of the oxidized AlAs layer ($Al_xO_y$) and $Al_{0.3}Ga_{0.7}As$ with a low Al content.

Circles Q1 and Q2 indicated by one-dot chain lines in FIG. 2 represent an oxidation distance when the semiconductor multilayer reflection mirror 16 is oxidized through the hole 40A. In other words, the circles Q1 and Q2 represent the boundary between the oxidized DBR 16A and the conductive DBR 16B. The hole 40A is formed between adjacent two light-emitting thyristors, and the oxidized DBRs 16A of two light-emitting thyristors are formed using one hole 40A. Circles Q3 and Q4 represent the oxidation distance when the semiconductor multilayer reflection mirror 16 is oxidized through the hole 40B, the oxidized DBRs 16A of light-emitting thyristors 10-3 and 10-4 are formed by the oxidation of these semiconductor multilayer reflection mirrors 16.

In the oxidized DBR 16B obtained in this way, it is possible to obtain reflectivity of 99% with a small number of pairs (for example, 3 to 5 pairs). Moreover, although the light-emitting thyristor 10 generates light having a relatively wide range of wavelengths unlike a semiconductor laser, the oxidized DBR 16A may provide high reflectivity in such a wide range of wavelengths. As described later, the oxidized DBR 16A is formed so as to entirely or partially overlap with a conductive region 26B of a current confining portion 26. Alternatively, the oxidized DBR 16A may be formed so as to overlap with the mesa structure M2. Moreover, a non-oxidized portion of the semiconductor multilayer reflection mirror 16, namely the conductive DBR 16B provides an electrical connection between the semiconductor substrate 12 and the first semiconductor layer 18.

The first semiconductor layer 18 is made from p-type AlGaAs and includes the current confining portion 26 that is made from p-type AlAs extending in a plane parallel to the principal surface of the substrate. That is, the first semiconductor layer 18 has a multilayer structure including a lower AlGaAs layer 18A, the current confining portion 26 formed thereon, and an upper AlGaAs layer 18B formed thereon. When a light-emitting thyristor array is manufactured, the mesa structure M1 having a rectangular shape is formed on the semiconductor multilayer reflection mirror 16, and a side surface of the current confining portion 26 is exposed through the mesa structure M1. In the current confining portion 26, the oxidized region 26A which is selectively oxidized from the side surface of the mesa structure M1 and the conductive region 26B which is surrounded by the oxidized region 26A are formed. The oxidation of the oxidized DBR 16A and/or the oxidized region 26A is controlled so that the conductive region 26B entirely or partially overlaps with the oxidized DBR 16A, in other words, so that the conductive region 26B and the oxidized DBR 16A face each other. More preferably, the conductive region 26B is formed so as to be smaller than the diameter or size of the mesa structure M2 on the mesa structure M1. Since carriers (holes) injected from an anode pass through the conductive region 26B having a limited area, it is possible to increase the density of the carriers injected into the second semiconductor layer 20. The current confining portion 26 is not necessarily limited to AlAs, and may be made from $Al_{0.98}Ga_{0.02}As$ in which the Al content ratio is 98% or more.

The second semiconductor layer 20 made from n-type AlGaAs is formed to a predetermined thickness on the first semiconductor layer 18, and the third semiconductor layer 22 made from p-type AlGaAs is formed to a predetermined thickness on the second semiconductor layer 20. Furthermore, the fourth semiconductor layer 24 made from n-type AlGaAs is formed to a predetermined thickness on the third semiconductor layer 22. The fourth semiconductor layer 24 is etched so that the mesa structure M2 having a rectangular shape is formed on the mesa structure M1, and a gate electrode (not illustrated) is electrically connected to the third semiconductor layer 22 exposed through the mesa structure M2. Preferably, the mesa structure M2 is positioned at such a position that the mesa structure M2 overlaps with the conductive region 26B of the current confining portion 26. In other words, the center of the mesa structure M2 is approximately identical to the center of the conductive region 26B.

The upper electrode 32 as a cathode electrode is formed on the fourth semiconductor layer 24. An n-type GaAs contact layer 24A having a high impurity concentration may be formed on the fourth semiconductor layer 24. Moreover, the upper electrode 32 may be disposed in such a ring shape that the upper electrode 32 does not overlap with the conductive region 26B of the current confining portion 26. In this way, it is possible to increase the quantity of emitted light further. The rear-surface electrode 30, the upper electrode 32, and the gate electrode are formed by depositing a single layer or a stacked layer of a metal material such as Au, AuGe, Ni, Ti, or Mo by a lift-off process, for example.

When a forward bias is applied between the rear-surface electrode 30 and the upper electrode 32 so that a driving signal is applied to the gate electrode, carriers (holes) injected from the anode side are injected into the first semiconductor layer 18 through the conductive DBR 16B. The carriers are further injected into the second semiconductor layer 20 with the carrier density increased by the current confining portion 26, whereby the carriers combine with electrons injected from the cathode side. The conductive region 26B of the current confining portion 26 suppresses carriers (holes) from being injected around the mesa structure M1, whereby the carrier density near the center of the mesa structure M1 that is right below the upper electrode 32 is increased. In this way, the intensity of light near the center of the mesa structure M1 increases, and most of light moving toward the substrate among the light is reflected toward the upper electrode by the oxidized DBR 16A, whereby absorption by the substrate is suppressed. As a result, emission efficiency of the light-emitting thyristor is improved, and light having high intensity can be obtained from the uppermost layer.

FIG. 2 illustrates four light-emitting thyristors 10-1 to 10-4 as part of a light-emitting thyristor array. Rectangular holes 40A and 40B for oxidation are formed between adjacent light-emitting thyristors. The hole 40A is disposed between the mesa structures M1 of the light-emitting thyristors 10-1 and 10-2, and in this example, is formed near the corners of the mesa structures M1. The circle Q1 indicated by a broken line is the range of the oxidized DBR 16A that is formed in the light-emitting thyristor 10-1 via the hole 40A, and the circle Q2 is the range of the oxidized DBR 16A that is formed in the light-emitting thyristor 10-2 via the hole 40A. On the other hand, a rectangle K indicated by broken lines represents the boundary between the conductive region 26B and the oxidized region 26A of the current confining portion 26 of the first semiconductor layer 18, and the rectangle has a plan-view shape corresponding to the outline of the mesa structure M1. Focusing on the light-emitting thyristor 10-1, the conductive region 26B thereof is in such a positional relation that it overlaps with the oxidized DBR 16A indicated by the circle Q1. Moreover, the conductive region 26B of the light-emitting thyristor 10-2 is in such a positional relation that it overlaps with the oxidized DBR 16A indicated by the circle Q2. The same overlapping relation is true for the light-emitting thyristors 10-3 and 10-4. The overlapping positional relation means that when the semiconductor substrate is viewed from directly above, the oxidized DBR 16A and the conductive region 26B are at such positions that they are entirely or partially superimposed on each other.

The cathode-side upper electrodes 32 are formed on the mesa structures M2 of the light-emitting thyristors 10-1 to 10-4, and the respective upper electrodes 32 are connected to the metal wiring 32A extending in parallel to the arrangement direction of the light-emitting thyristors.

Figure 3:
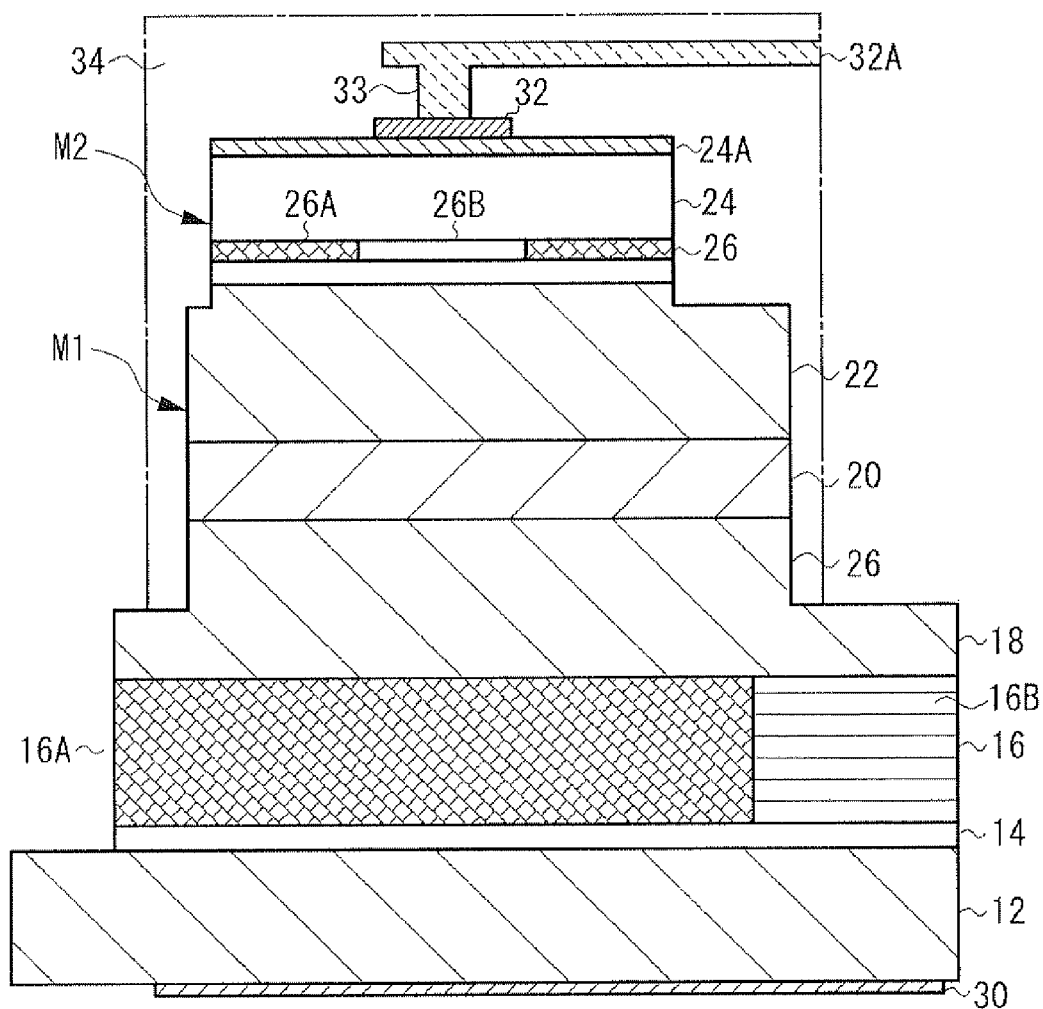
FIG. 3 is a diagram illustrating another example of the structure of the light-emitting thyristor according to the first exemplary embodiment of the present invention.

FIG. 3 is a diagram illustrating another example of the structure of the light-emitting thyristor according to the first exemplary embodiment of the present invention. A light-emitting thyristor 10A of this example is different from the electrode layer 10 illustrated in FIG. 1 in that the light-emitting thyristor 10A includes an n-type GaAs semiconductor substrate. The light-emitting thyristor 10A of this example includes an n-type GaAs buffer layer 14, a semiconductor multilayer reflection mirror 16 including an oxidized DBR 16A and an n-type conductive DBR 16B, a first semiconductor layer 18 made from n-type GaAs, a second semiconductor layer 20 made from p-type GaAs, a third semiconductor layer 22 made from n-type GaAs, and a fourth semiconductor layer 24 including p-type GaAs, which are formed on an n-type GaAs semiconductor substrate 12. A current confining portion 26 is formed in the fourth semiconductor layer 24 which is an anode layer and is made from p-type AlAs, for example. The current confining portion 26 includes an oxidized region 26A which is selectively oxidized from a side surface of a mesa structure M2 and a conductive region 26B which is surrounded by the oxidized region 26A. Moreover, the current confining portion 26 confines a conduction path of carriers (holes) injected from an anode-side upper electrode 32 to thereby increase the density of carriers injected into the third semiconductor layer 22. In this example, the conductive region 26B of the current confining portion 26 is also in such a positional relation that it overlaps with the oxidized DBR 16A. Since holes have lower mobility than electrons, by providing the current confining portion on the anode side, it is possible to improve the probability of hole-electron recombination more effectively. However, the current confining portion may be formed in an n-type semiconductor layer.

Figure 4A:
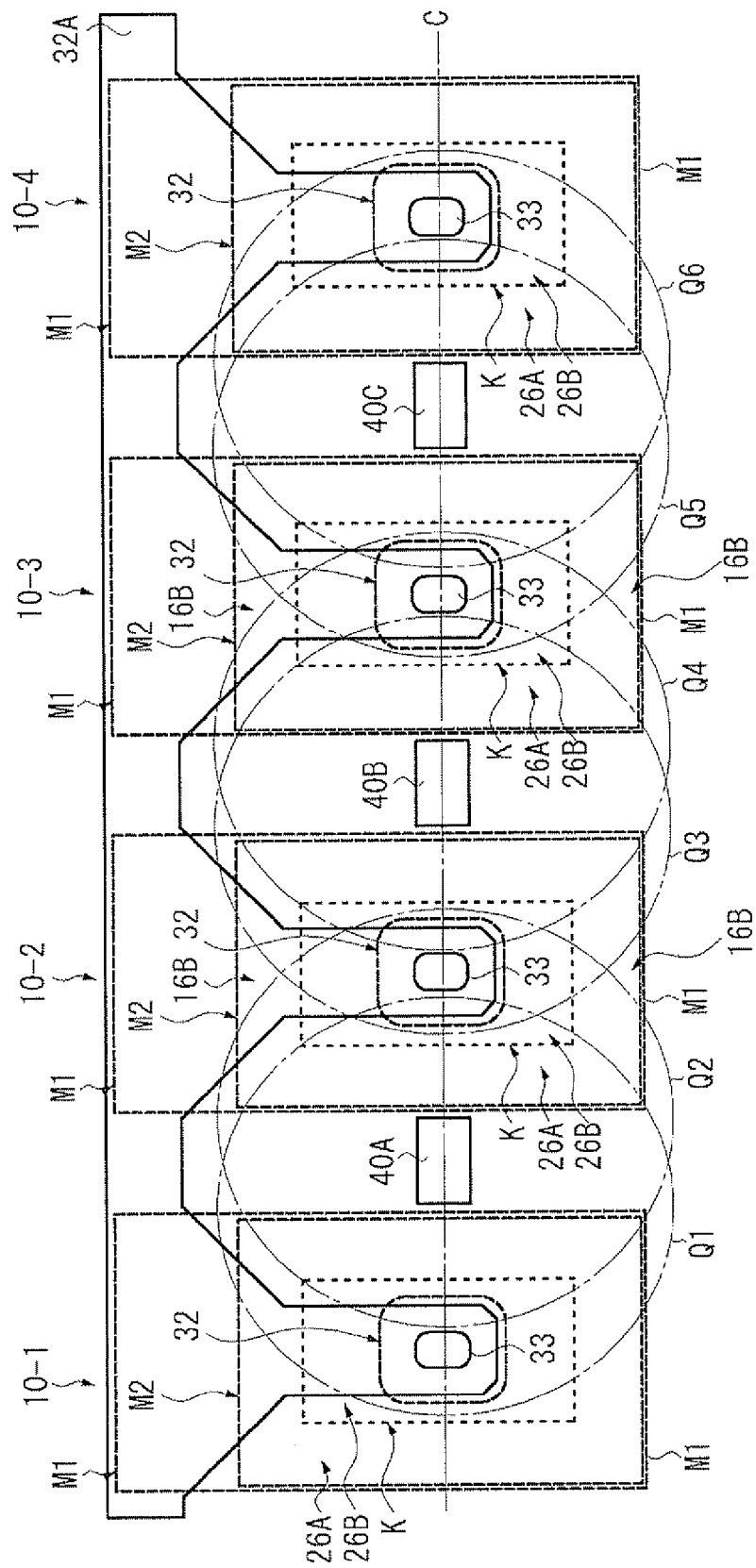
FIG. 4A is a schematic plan view of a light-emitting thyristor array according to the second exemplary embodiment of the present invention.
Figure 4C:
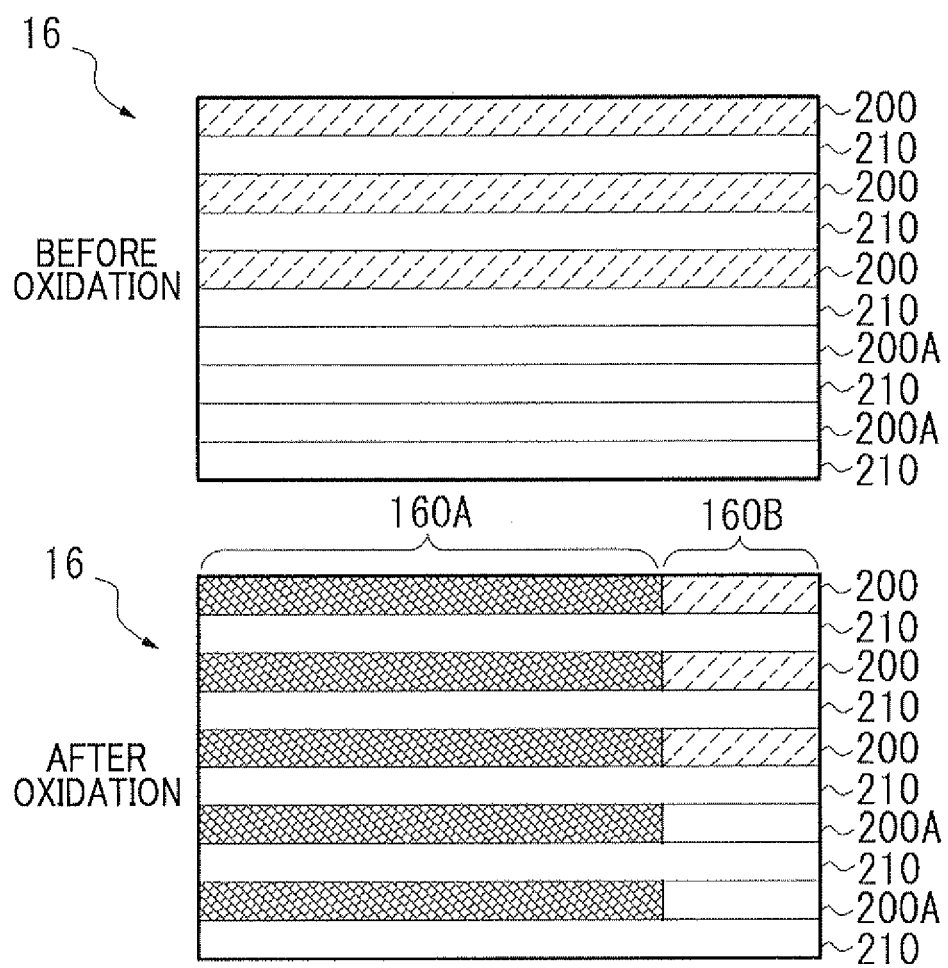
FIG. 4C is a cross-sectional view illustrating the structure of another semiconductor multilayer reflection mirror according to the third exemplary embodiment of the present invention.

Next, FIG. 4A illustrates a schematic plan view of a light-emitting thyristor array according to a second exemplary embodiment of the present invention. In the second exemplary embodiment, although holes 40A, 40B, and 40C for oxidation are formed between adjacent two light-emitting thyristors of the light-emitting thyristors 10-2 to 10-4, the formed positions thereof are on the line passing through the approximate center C of the mesa structure M1. When the mesa structure M1 has a rectangular shape in plan view, the intersection of the diagonal lines thereof is the center C. Circles Q1 to Q6 indicated by broken lines represent the ranges of the oxidized DBRs 16A when the holes 40A to 40C are used. The oxidized DBR 16A of one light-emitting thyristor is formed by oxidation occurring from holes positioned on both sides thereof. Here, focusing on the light-emitting thyristor 10-2, the oxidized DBR 16A of the light-emitting thyristor 10-2 is determined by the circle Q2 which is the oxidation distance when the hole 40A is used and the circle Q3 which is the oxidation distance when the hole 40B is used. On the other hand, a rectangle indicated by broken lines represents the boundary between the conductive region 26B and the oxidized region 26A of the current confining portion 26 of the light-emitting thyristor 10-2. The conductive region 26B is in such a positional relation that it entirely overlaps with the oxidized DBR 16A similarly to the first exemplary embodiment.

In the second exemplary embodiment, since the oxidized DBR 16A is formed by oxidation occurring approximately around two holes positioned on both sides thereof, it is possible to decrease the oxidation distances indicated by the circles Q1 to Q6 as compared to the first exemplary embodiment. As a result, since the area of the conductive DBR 16E of the semiconductor multilayer reflection mirror 16 increases, it is possible to decrease the resistance of the light-emitting thyristor. In addition, since oxidation occurs from the holes on both sides thereof, two conductive DBRs 16E remain within the mesa structure M1 of the semiconductor multilayer reflection mirror 16 (see FIG. 4A). Thus, carriers are injected from both sides of the first semiconductor layer 18, and the carrier density is effectively improved by the current confining portion 26. Moreover, it is possible to decrease electrical resistance between the semiconductor substrate 12 and the first semiconductor layer 18.

Next, a light-emitting thyristor according to a third exemplary embodiment of the present invention will be described. As illustrated in FIG. 1 and FIG. 3, an oxidized DBR 16A and a conductive DBR 16B are formed in a semiconductor multilayer reflection mirror 16, and a first semiconductor layer 18 is electrically connected to a semiconductor substrate 12 via the conductive DBR 16B. Here, when a current path passing through the conductive DBR 16B is narrowed, or the thickness of the first semiconductor layer (anode layer) 18 remaining after formation of the mesa structure M1 decreases, the resistance of the current path increases. However, if a doping level of the first semiconductor layer 18 is increased, since a problem of light absorption by impurities occurs, it is difficult to increase the doping level of the first semiconductor layer 18. Therefore, in the third exemplary embodiment, by increasing the doping level of impurities of a layer to be oxidized in the semiconductor multilayer reflection mirror 16, carriers of the layer to be oxidized in the semiconductor multilayer reflection mirror 16 are made easy to flow through the first semiconductor layer 18, and the resistance of the current path decreases. Moreover, when the layer to be oxidized is oxidized, since light absorption by impurities does not occur, an increase of light absorption under a light-emitting region does not occur.

FIG. 4B illustrates the cross section of the semiconductor multilayer reflection mirror 16 used in the light-emitting thyristor according to the third exemplary embodiment. The semiconductor multilayer reflection mirror 16 is formed by stacking multiple pairs of a low refractive index layer 200 having a high Al content and a high refractive index layer 210 having a low Al content. In a preferred aspect, the low refractive index layer 200 is formed from an AlAs layer, and the doping level of impurities of the low refractive index layer 200 is larger than the doping level of the high refractive index layer 210 and larger than the doping level of the first semiconductor layer 18. The doping level of the low refractive index layer 200 is $1 \times 10^{18}$ to $1 \times 10^{19}$ cm$^{-3}$, for example. When the oxidized DBR 16A is formed in the semiconductor multilayer reflection mirror 16, since the low refractive index layer 200 is converted into Al$_x$O$_y$, light absorption by impurities substantially does not occur. Thus, generated light is not absorbed but is effectively reflected upward by the oxidized DBR 16A. Moreover, since carriers of the low refractive index layer 200 in the conductive DBR 163 flow through the first semiconductor layer 18, the resistance decreases. The low refractive index layer 200 may be an AlGaAs layer in which a small amount of Ga is included.

A modification of the third exemplary embodiment is illustrated in FIG. 40. In this modification, a semiconductor multilayer reflection mirror 16 is configured to include a low refractive index layer 200 in which impurities are doped in a high concentration and a low refractive index layer 200A in which impurities are not doped in a high concentration. In the example of the drawing, three AlAs layers 200A adjacent to a first semiconductor layer 18 are doped in a high concentration. The doping concentration is $5 \times 10^{18}$ to $1 \times 10^{19}$ cm$^{-3}$, for example. In this case, it is also possible to provide an oxidized DBR 16A as a high-reflectivity layer and a low-resistance conductive DBR 165.

Figure 5A:
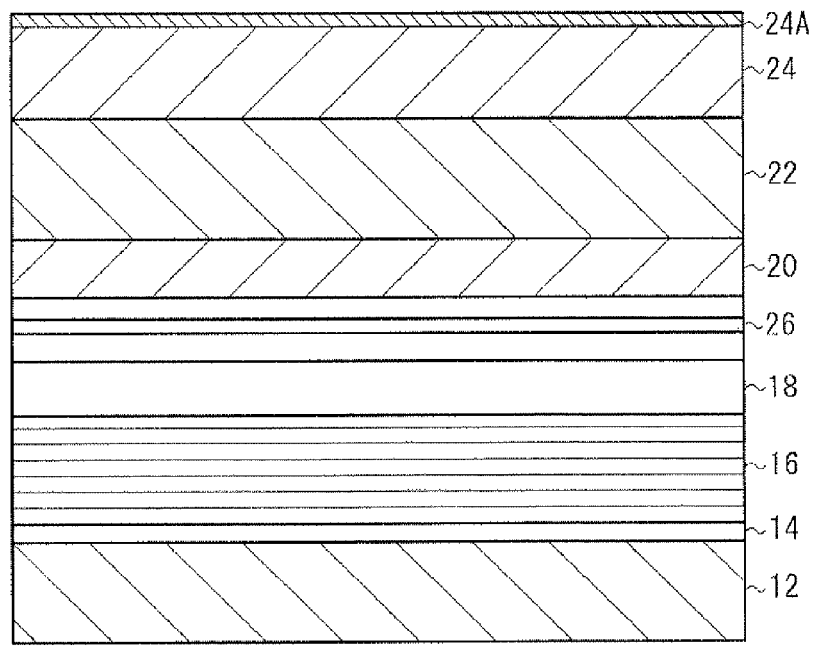
FIGS. 5A and 5B are diagrams illustrating an example of the steps of manufacturing the light-emitting thyristor according to the first exemplary embodiment of the present invention.

Next, a method of manufacturing the light-emitting thyristor array according to the first exemplary embodiment of the present invention will be described. First, as illustrated in FIG. 5A, by a MOCVD process, a p-type GaAs buffer layer 14, a semiconductor multilayer reflection mirror 16 including multiple pairs of a p-type AlAs layer and an Al$_{0.3}$Ga$_{0.7}$As layer, a p-type lower GaAs layer 18A, a current confining portion 26 formed of a p-type AlAs layer, a p-type upper GaAs layer 18B, a second semiconductor layer 20 of n-type GaAs, a third semiconductor layer of p-type GaAs, and a fourth semiconductor layer 24 of n-type GaAs are formed on a p-type GaAs substrate 12.

Figure 6A:
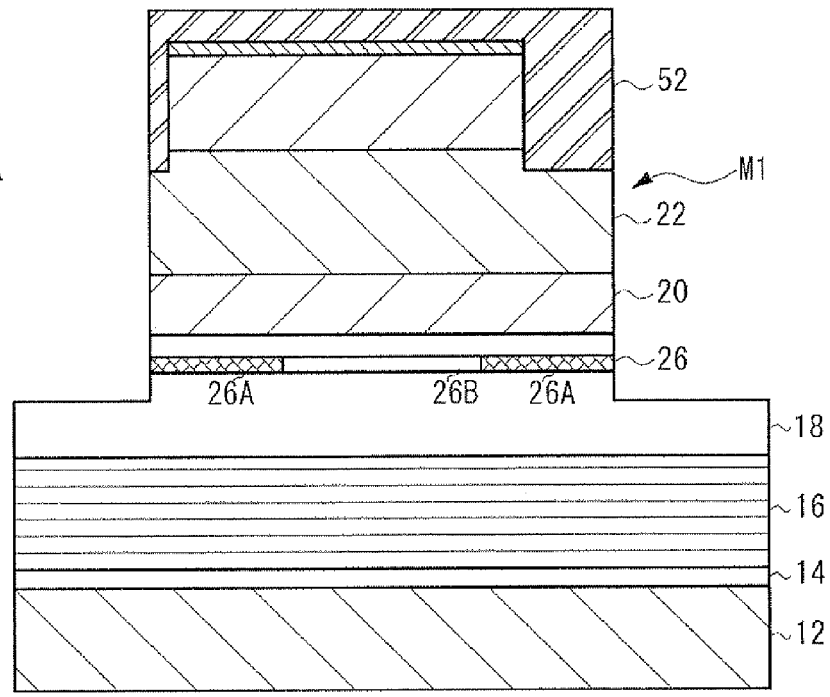
FIGS. 6A and 6B are diagrams illustrating an example of the steps of manufacturing the light-emitting thyristor according to the first exemplary embodiment of the present invention.

Subsequently, as illustrated in FIG. 55, a rectangular mask pattern 50 is formed on the fourth semiconductor layer 24, and anisotropic etching is performed using the mask pattern 50 such that the third semiconductor layer 22 is exposed. In this way, a rectangular mesa structure M2 is formed. Subsequently, after the mask pattern 50 is removed, as illustrated in FIG. 6A, a mask pattern 52 is formed so as to cover part of the fourth semiconductor layer 24 and the third semiconductor layer, and anisotropic etching is performed using the mask pattern 52 so that semiconductor layers extending from the third semiconductor layer 22 to the first semiconductor layer 18 are etched. In this way, a rectangular mesa structure M2 is formed.

Figure 6B:
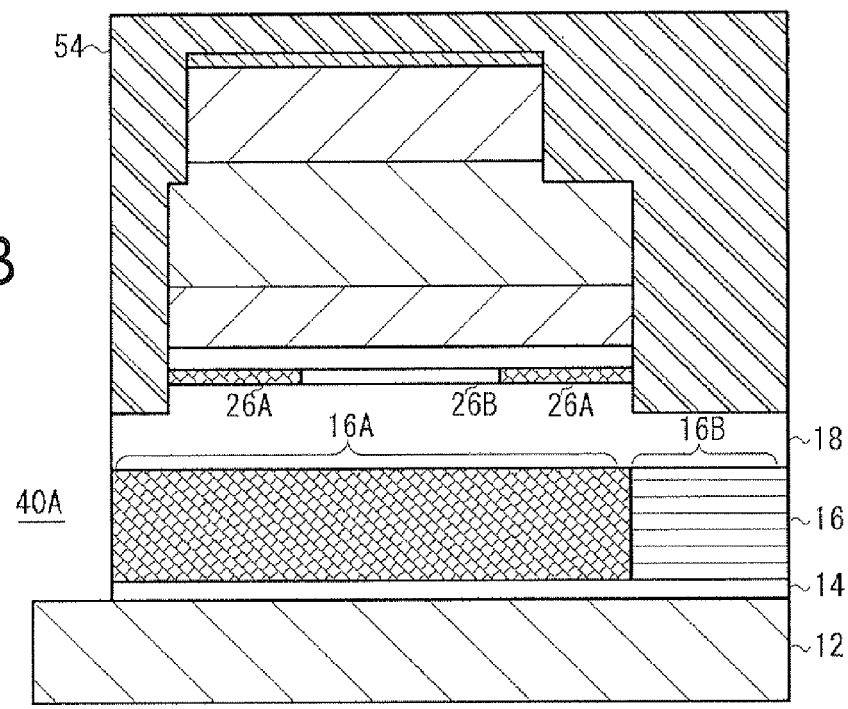

Subsequently, the current confining portion 26 is oxidized. By exposing a semiconductor wafer to an oxidizing atmosphere of about 340° C., for example, an oxidized region 26A which is selectively oxidized from a side surface of the mesa structure M1 is formed in the current confining portion 26. Subsequently, after the mask pattern 52 is removed, a mask pattern 54 for covering the mesa structures M1 and M2 and forming a hole 40A (40B) for oxidation is formed, and the hole 40A for oxidation is formed using the mask pattern 54. The hole 40A for oxidation may have such a depth that it reaches at least the semiconductor multilayer reflection mirror 16. By oxidizing the semiconductor wafer again, an oxidized DBR 16A which starts from the hole 40A is formed in the semiconductor multilayer reflection mirror 16 as illustrated in FIG. 6B. In this case, the oxidation is controlled so that the oxidized DBR 16A overlaps entirely or partially with the conductive region 26B of the current confining portion 26.

Figure 5B:
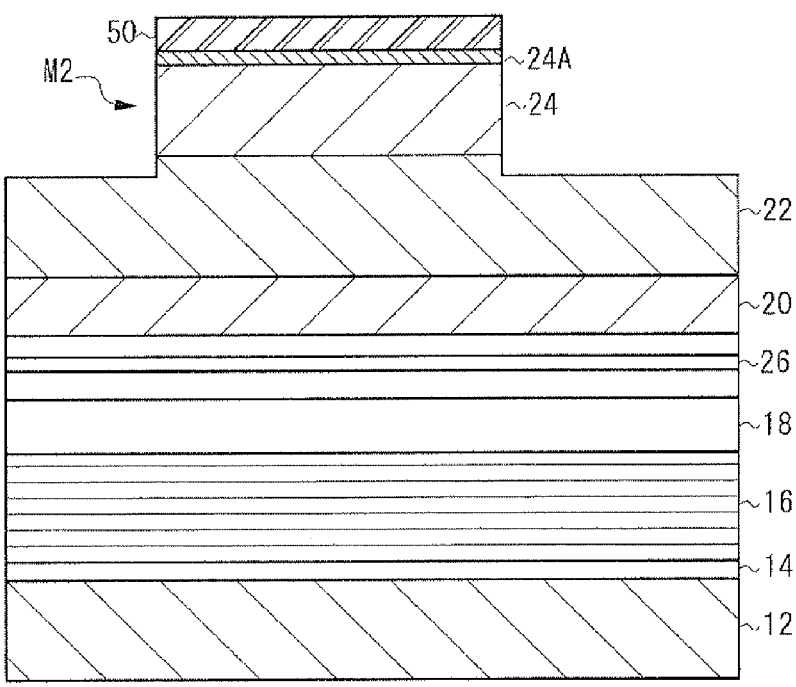
Figure 6C:
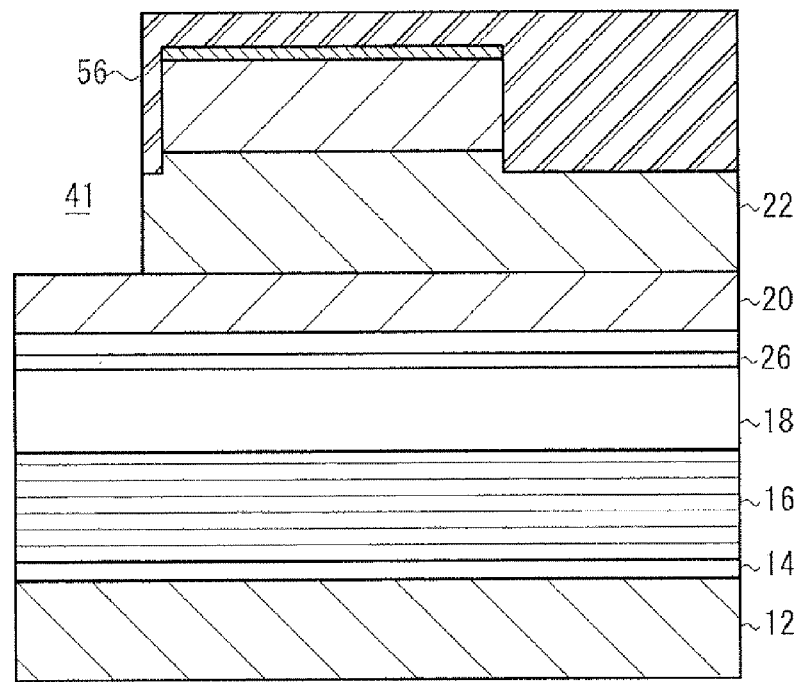
FIGS. 6C and 6D are diagrams illustrating another example of the steps of manufacturing the light-emitting thyristor according to the exemplary embodiment of the present invention.
Figure 6D:
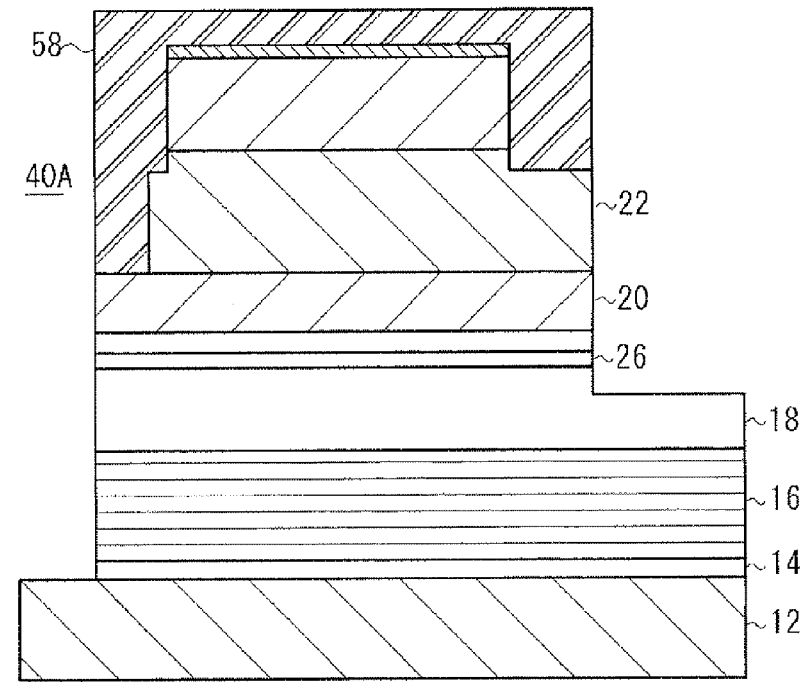
Figure 6E:
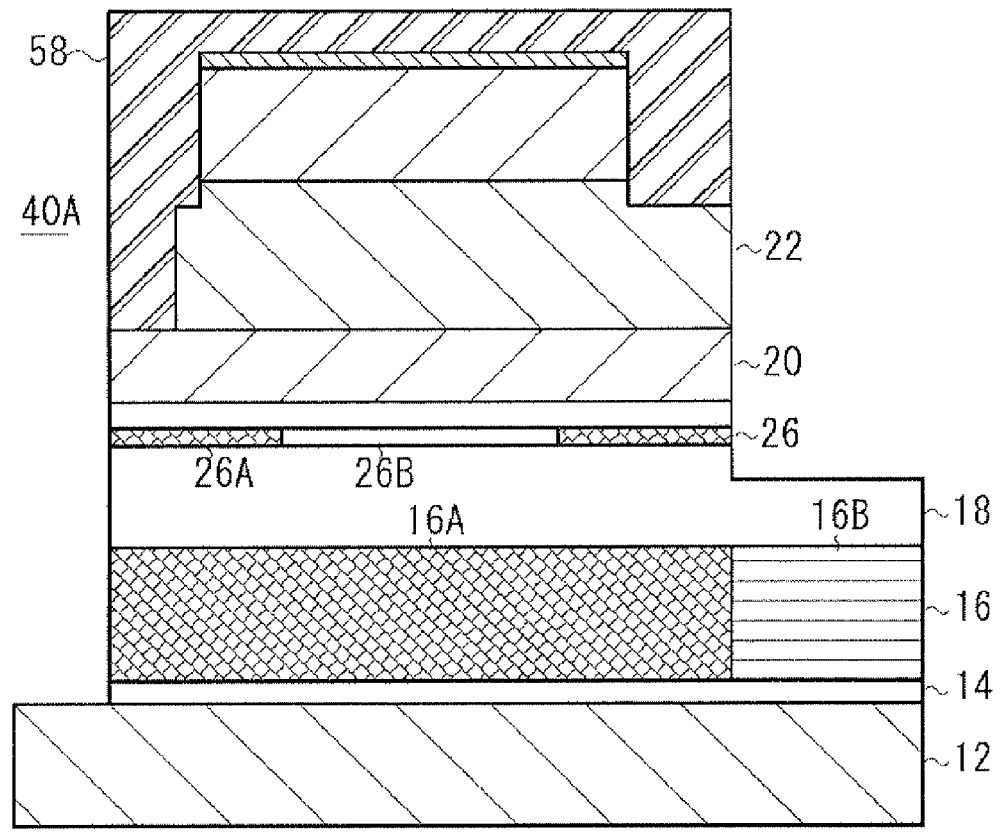
FIG. 6E is a diagram illustrating another example of the steps of manufacturing the light-emitting thyristor according to the exemplary embodiment of the present invention.

In the above manufacturing method, although an example in which the steps of oxidizing the current confining portion 26 and the semiconductor multilayer reflection mirror 16 are performed separately has been described, these oxidation steps may be performed simultaneously. A step in which the oxidation steps are performed simultaneously is illustrated in FIGS. 6A and 6B. First, a mesa structure M2 is formed in the steps illustrated in FIGS. 5A and 5B. Subsequently, as illustrated in FIG. 6C, a mask pattern 56 is formed using a predetermined photolithography step, and a second etching step is performed. By this etching, a trench 41 for forming the holes 40A and 40B for oxidation is formed in the third semiconductor layer 22. Subsequently, after the mask pattern 56 is removed, a mask pattern 58 as illustrated in FIG. 6D is formed, the hole 40A is formed through the trench 41, and the mesa structure M1 is formed. Subsequently, by an oxidation step, the oxidized region 26A is formed in the first semiconductor layer 18 from the side surface of the mesa structure M1, and simultaneously with this, the oxidized DBR 16A is formed in the semiconductor multilayer reflection mirror 16 through the hole 40A.

Here, although the oxidized region 26A is oxidized from the side surface of the mesa structure M1, since the oxidized DBR 16A is oxidized from the hole 40A, the oxidized DBR 16A and the conductive region 26B are in an overlapping positional relation. Thus, it is necessary to make the oxidation distance of the oxidized DBR 16A greater than the oxidation distance of the oxidized region 26A. The oxidation rate of an Al layer to be oxidized depends on the thickness and Al content thereof. That is, the oxidation rate increases as the thickness increases, and the oxidation rate increases as the Al content increases. Therefore, by making the thickness or the Al content of the oxidized DBR 16A greater than that of the oxidized region 26A, it is possible to make the oxidation distance of the oxidized DBR 16A greater than the oxidation distance of the oxidized region 26A.

In the above exemplary embodiments, although an example in which the mesa structures M1 and M2 as a columnar structure have a rectangular shape has been described, the mesa structures M1 and M2 may have other shapes (for example, a cylindrical shape). Moreover, the size of each of the mesa structures M1 and M2 may be appropriately selected depending on the size of the upper electrode 32, the size of the conductive region 26B of the current confining portion 26, and the like. In addition, although an example in which the holes for oxidation 40A to 40C have a rectangular shape has been described, the holes 40A to 40C may have other shapes (for example, a circular shape). Furthermore, in the above exemplary embodiments, although an example in which the light-emitting thyristors are disposed in a one-dimensional direction has been described, the light-emitting thyristors may form an array in which they are arranged in two dimensions.

Figure 7:
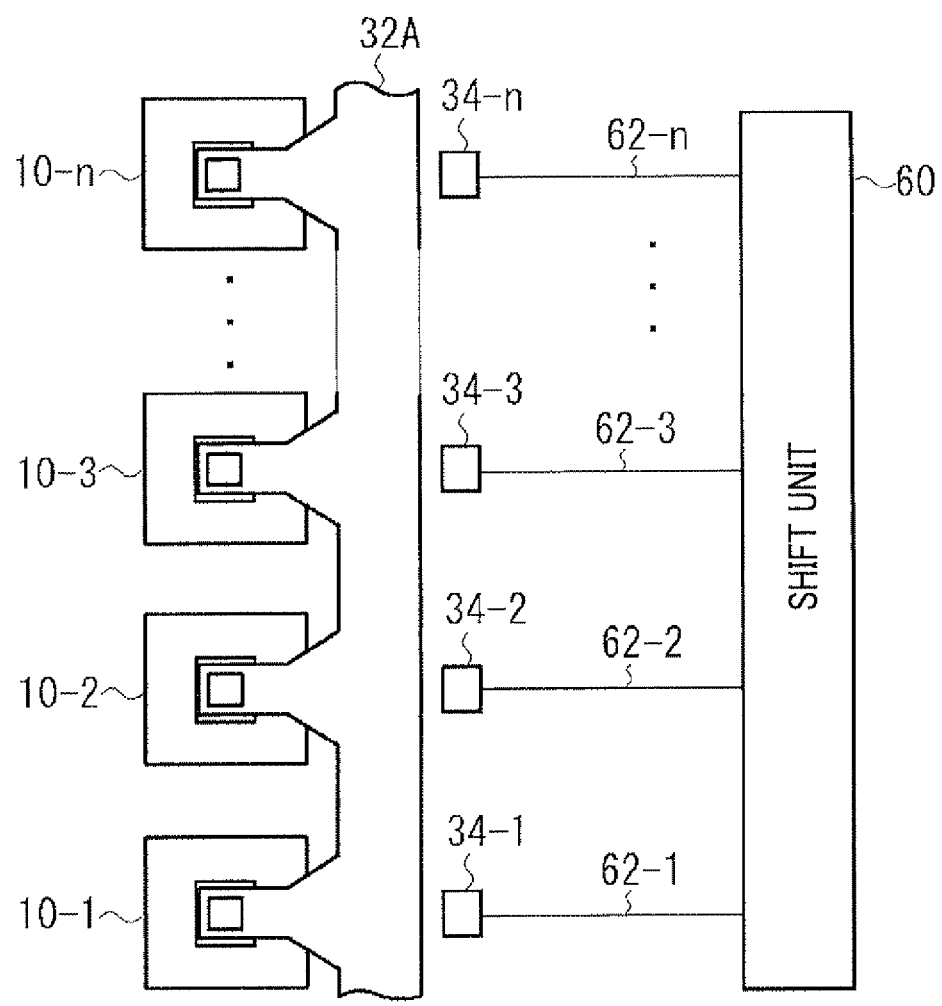
FIG. 7 is a schematic plan view of a light-emitting device array according to the present exemplary embodiment.

FIG. 7 is a schematic plan view of a self-scanning light-emitting device array including the light-emitting thyristor of the present exemplary embodiment. As illustrated in FIG. 7, multiple light-emitting thyristors 10-1, 10-2, . . . , and 10-$n$ and a shift unit 60 that scans the respective light-emitting thyristors are formed on a single semiconductor substrate. The light-emitting thyristors 10-1 to 10-$n$ are arranged in a linear form, and cathode electrodes 32 of the respective light-emitting thyristors are connected to a main wiring layer 32A extending in a direction perpendicular to the cathode electrodes 32. The main wiring layer 32A extends in parallel to the arrangement direction of the light-emitting thyristors. Gate electrodes 34-1, 34-2, . . . , and 34-$n$ of the respective light-emitting thyristors are connected to driving signals 62-1, 62-2, . . . , and 62-$n$ from the shift unit 60, respectively. When the driving signal is applied to the gate electrode, the light-emitting thyristors are sequentially scanned. The same thyristor as the light-emitting thyristor can be used as the shift unit, and an application example thereof is disclosed in JP-A-1-238962, for example.

Figure 8:
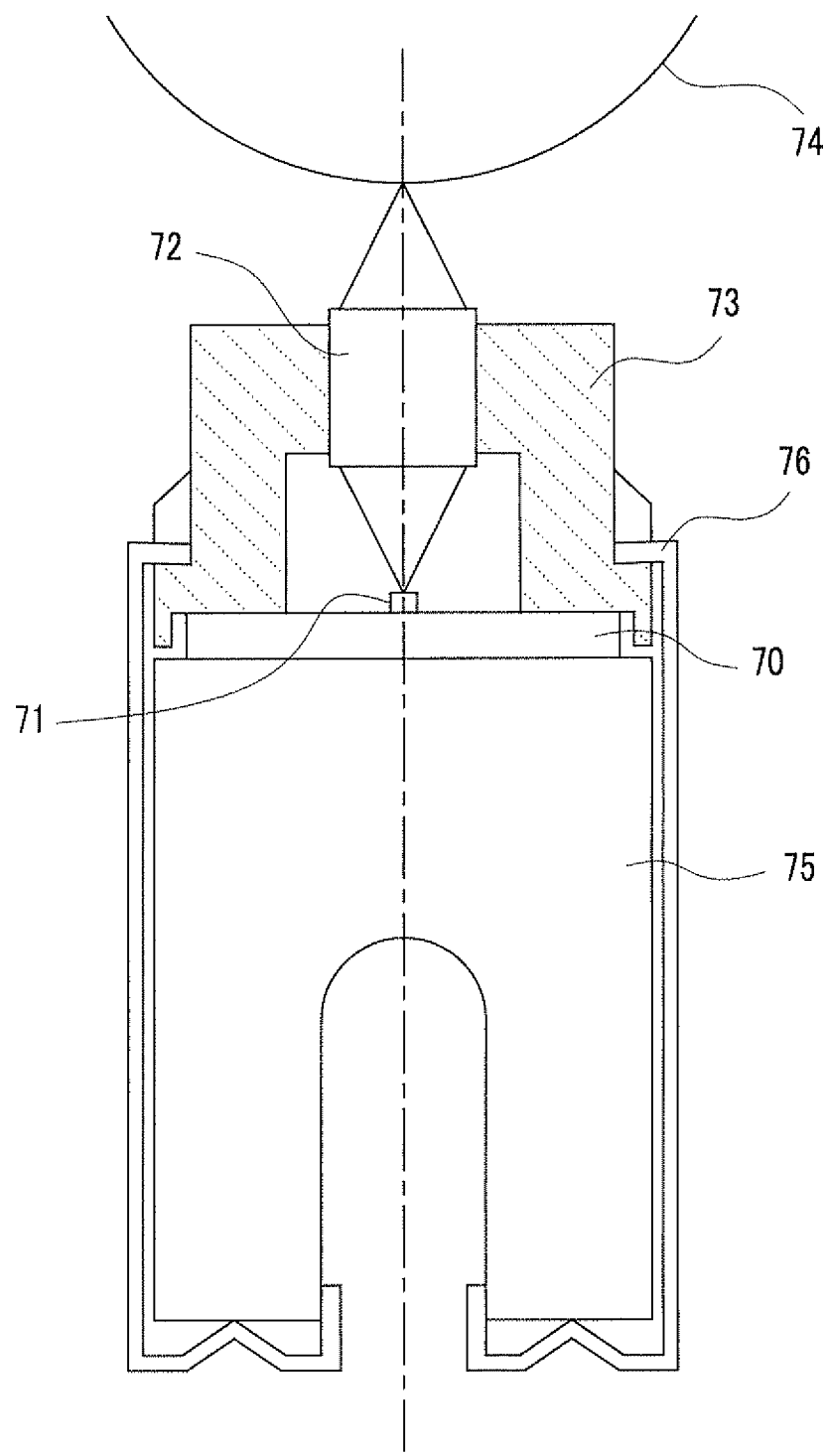
FIG. 8 is a diagram illustrating an example of the structure of an optical recording head to which a self-scanning light-emitting device array according to the present exemplary embodiment is applied.

The self-scanning light-emitting device array described above is used in an optical recording head of an optical printer, for example. FIG. 8 illustrates an example of an optical recording head using a self-scanning light-emitting device array. Multiple light-emitting device array chips 71 in which light-emitting thyristors are disposed in a line are mounted in a main-scanning direction on a chip mounting substrate 70. An erecting equal-magnification rod lens array 72 which is long in the main-scanning direction is disposed on an optical path of light emitted by the light-emitting devices of the light-emitting device array chip 71 and is fixed by a resin housing 73. A photoconductor drum 74 is provided on the optical path of the rod lens array 72. Moreover, a heat sink 75 for dissipating heat of the light-emitting device array chip 71 is provided under the chip mounting substrate 70, and the housing 73 and the heat sink 75 are fixed by a clamping bracket 76 with the chip mounting substrate 70 interposed.

Figure 9:
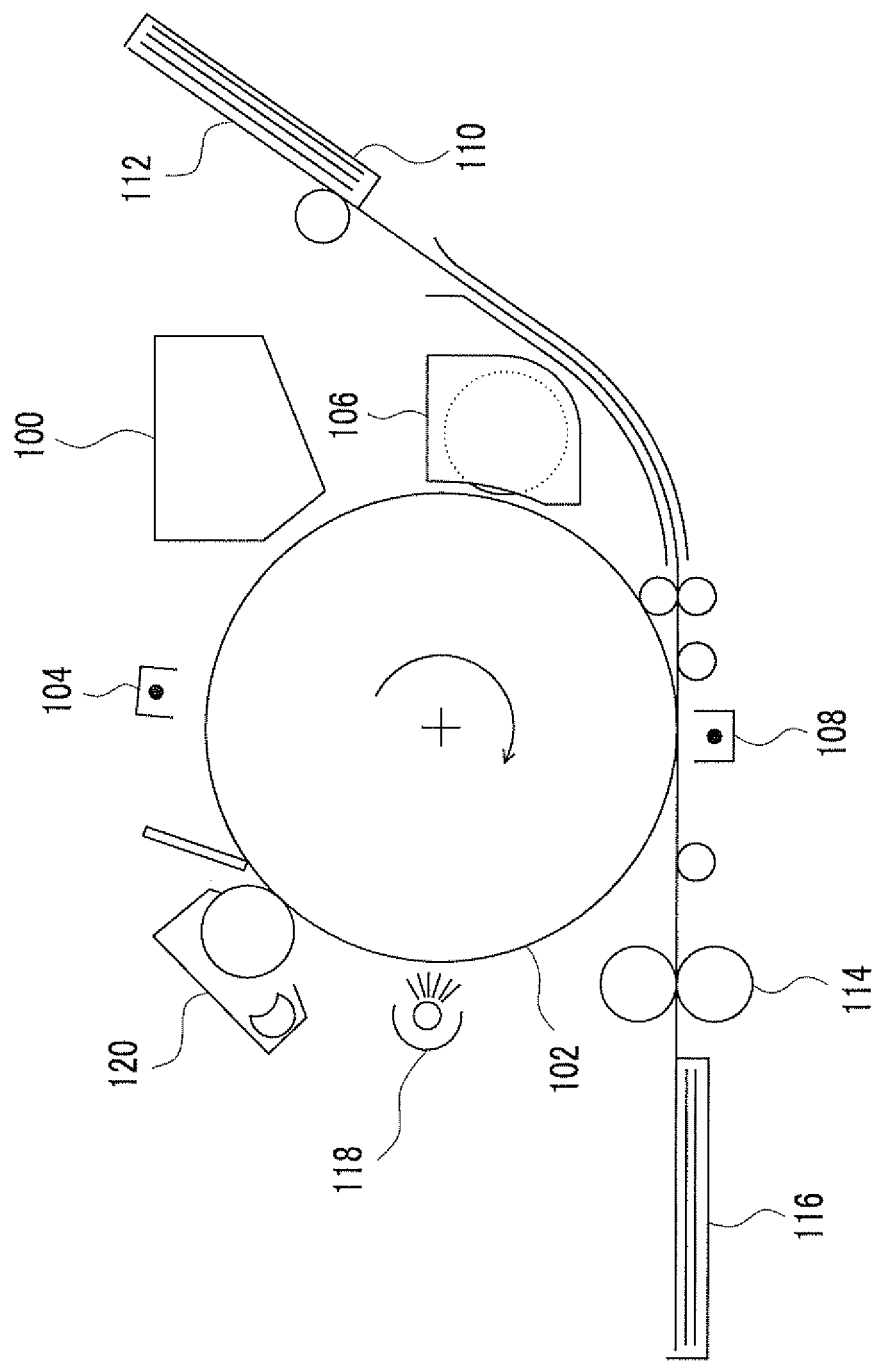
FIG. 9 is a diagram illustrating an example in which the optical recording head using the self-scanning light-emitting device array according to the present exemplary embodiment is applied to an optical printer.

FIG. 9 illustrates an optical printer using the optical recording head illustrated in FIG. 8. An optical recording head 100 is installed in the optical printer. A material (photoconductor) having photoconductivity such as amorphous Si is formed on the surface of a cylindrical photoconductor drum 102. This drum 102 rotates at the speed of printing. The surface of the photoconductor of the rotating drum 102 is uniformly charged by a charger 104. Moreover, the optical recording head 100 irradiates the photoconductor with light of dot images to be printed to thereby neutralize the charged portions which are irradiated with light, whereby a latent image is formed. Subsequently, a developing unit 106 attaches toner onto the photoconductor in accordance with the charged state of the photoconductor. Moreover, a transfer unit 108 transfers toner onto a sheet 112 fed from a cassette 110. The toner on the sheet is heated and fixed by a fixing unit 114, and then, the sheet is transported to a stacker 116. On the other hand, the entire surface of the drum 102 having undergone the transferring is neutralized by an erase lamp 118, and remaining toner is removed by a cleaning unit 120. Such an optical recording head can be used in an image forming apparatus such as a facsimile or a copier as well as a printer.

While exemplary embodiments of the present invention have been described hereinabove, the present invention is not limited to specific exemplary embodiments, but various modifications and changes can be made within the scope of the present invention described in the claims.

The foregoing description of the exemplary embodiments of the present invention has been provided for the purposes of illustration and description. It is not intended to be exhaustive or to limit the present invention to the precise forms disclosed. Obviously, many modifications and variations will be apparent to practitioners skilled in the art. The embodiments were chosen and described in order to best explain the principles of the present invention and its practical applications, thereby enabling others skilled in the art to understand the present invention for various embodiments and with the various modifications as are suited to the particular use contemplated. It is intended that the scope of the present invention be defined by the following claims and their equivalents.

What is claimed is:
1. A light-emitting device comprising:
 a semiconductor substrate of a first conductivity type;
 a semiconductor multilayer reflection mirror of the first conductivity type, formed on the semiconductor substrate;

a first semiconductor layer of the first conductivity type, formed on the semiconductor multilayer reflection mirror;
a second semiconductor layer of a second conductivity type different from the first conductivity type, formed on the first semiconductor layer;
a third semiconductor layer of the first conductivity type, formed on the second semiconductor layer;
a fourth semiconductor layer of the second conductivity type, formed on the third semiconductor layer;
a first electrode formed on a rear surface of the semiconductor substrate; and
a second electrode formed on the fourth semiconductor layer,
wherein the semiconductor multilayer reflection mirror includes a first oxidized region which is selectively oxidized and a first conductive region adjacent to the first oxidized region, and
the first conductive region electrically connects the semiconductor substrate and the first semiconductor layer;
wherein at least one of the first to fourth semiconductor layers includes a current confining portion,
the current confining portion includes a second oxidized region which is selectively oxidized and a second conductive region which is surrounded by the second oxidized region, and
the second conductive region is in such a positional relation that the second conductive region overlaps with the first oxidized region.

2. The light-emitting device according to claim 1, wherein the current confining portion is formed in a semiconductor layer on an anode side.

3. The light-emitting device according to claim 1, wherein an impurity concentration of at least one semiconductor layer included in the semiconductor multilayer reflection mirror is higher than an impurity concentration of the first semiconductor layer.

4. The light-emitting device according to claim 1, wherein the semiconductor multilayer reflection mirror includes a plurality of pairs of a high refractive index layer having a relatively high refractive index and a low refractive index layer having a relatively low refractive index, and
the first oxidized region is formed by oxidizing at least the low refractive index layer.

5. The light-emitting device according to claim 4, wherein the high refractive index layer is a low Al semiconductor layer having a relatively low Al content, and
the low refractive index layer is a high Al semiconductor layer having a relatively high Al content.

6. The light-emitting device according to claim 1, wherein an impurity concentration of at least one low refractive index layer of the semiconductor multilayer reflection mirror is higher than an impurity concentration of the first semiconductor layer.

7. The light-emitting device according to claim 6, wherein an impurity concentration of a semiconductor layer adjacent to the first semiconductor layer within the semiconductor multilayer reflection mirror is higher than an impurity concentration of the first semiconductor layer.

8. The light-emitting device according to claim 1, wherein the first oxidized region is selectively oxidized from a hole that reaches the semiconductor multilayer reflection mirror.

9. The light-emitting device according to claim 1, wherein the second oxidized region is selectively oxidized from a side surface of a first columnar structure formed on the semiconductor multilayer reflection mirror.

10. The light-emitting device according to claim 1, wherein when a second columnar structure is formed on the first columnar structure, the second columnar structure includes the fourth semiconductor layer, and the first oxidized region is in such a positional relation that the first oxidized region overlaps with the second columnar structure.

11. The light-emitting device according to claim 1, wherein a first oxidation distance of the first oxidized region is greater than a second oxidation distance of the second oxidized region.

12. The light-emitting device according to claim 1, wherein when the first conductivity type is a p-type, and the second conductivity type is an n-type, the current confining portion is formed in the first semiconductor layer.

13. The light-emitting device according to claim 1, wherein when the first conductivity type is an n-type, and the second conductivity type is a p-type, the current confining portion is formed in the fourth semiconductor layer.

14. A light-emitting device array comprising:
a plurality of the light-emitting devices according to claim 1 which are formed on the semiconductor substrate in an array form; wherein
a hole for oxidation for forming the first oxidized region is formed between adjacent light-emitting devices.

15. The light-emitting device array according to claim 14, wherein the hole for oxidation is used for forming the first oxidized regions of each of the adjacent light-emitting devices.

16. The light-emitting device array according to claim 14, wherein the light-emitting device array is a self-scanning light-emitting device array.

17. An optical recording head using the light-emitting device array according to claim 14.

18. An image forming apparatus comprising the optical recording head according to claim 17.

19. The light-emitting device according to claim 1, wherein the current confining portion is situated between a layer of the first conductivity type and a layer of the second conductivity type.

20. The light-emitting device according to claim 1, wherein the first oxidized region is not surrounded by the first conductive region.

21. A method of manufacturing a light-emitting device, comprising:
preparing a stacked structure including;
a semiconductor substrate of a first conductivity type,
a semiconductor multilayer reflection mirror of the first conductivity type, formed on the semiconductor substrate,
a first semiconductor layer of the first conductivity type, formed on the semiconductor multilayer reflection mirror,
a second semiconductor layer of a second conductivity type different from the first conductivity type, formed on the first semiconductor layer,
a third semiconductor layer of the first conductivity type, formed on the second semiconductor layer, and
a fourth semiconductor layer of the second conductivity type, formed on the third semiconductor layer;
forming a first columnar structure including at least the fourth semiconductor layer;

forming a second columnar structure including at least the first semiconductor layer under the first columnar structure and forming a hole that reaches the semiconductor multilayer reflection mirror; and forming a selectively oxidized region in the first semiconductor layer exposed by the second columnar structure and forming a first selectively oxidized region in the semiconductor multilayer reflection mirror exposed via the hole, wherein at least one of the first to fourth semiconductor layers includes a current confining portion, the current confining portion includes a second oxidized region which is selectively oxidized and a conductive region which is surrounded by the second oxidized region, and the conductive region is in such a positional relation that the conductive region overlaps with the first oxidized region.

22. The method of manufacturing a light-emitting device according to claim 21, wherein the semiconductor multilayer reflection mirror includes a plurality of pairs of a high refractive index layer having a relatively high refractive index and a low refractive index layer having a relatively low refractive index, and an impurity concentration of at least one low refractive index layer is higher than an impurity concentration of the first semiconductor layer.

\* \* \* \* \*